United States Patent [19]

Schwabe et al.

[11] Patent Number: 4,603,472
[45] Date of Patent: Aug. 5, 1986

[54] METHOD OF MAKING MOS FETS USING SILICATE GLASS LAYER AS GATE EDGE MASKING FOR ION IMPLANTATION

[75] Inventors: Ulrich Schwabe, Munich; Erwin P. Jacobs, Vaterstetten; Franz Neppl, Munich, all of Fed. Rep. of Germany

[73] Assignee: Siemens Aktiengesellschaft, Berlin & Munich, Fed. Rep. of Germany

[21] Appl. No.: 694,295

[22] Filed: Jan. 24, 1985

[30] Foreign Application Priority Data

Apr. 19, 1984 [DE] Fed. Rep. of Germany ....... 3415002

[51] Int. Cl.$^4$ .................. H01L 29/95; H01L 21/283; H01L 21/225
[52] U.S. Cl. .................................. 29/576 B; 29/571; 148/1.5; 148/187; 148/DIG. 133; 148/DIG. 82; 357/23.3; 357/91
[58] Field of Search .............. 29/576 B, 571; 148/1.5, 148/187; 357/91, 23.3

[56] References Cited

U.S. PATENT DOCUMENTS

| | | | |
|---|---|---|---|
| 4,404,73 | 9/1983 | Sasaki | 29/576 B |
| 4,345,366 | 8/1982 | Brower | 29/576 B |
| 4,348,802 | 9/1982 | Shirato | 29/571 |
| 4,356,623 | 11/1982 | Hunter | 29/571 |
| 4,366,613 | 1/1983 | Ogura et al. | 148/187 |
| 4,499,653 | 2/1985 | Kub et al. | 29/571 |
| 4,532,697 | 8/1985 | Ko | 29/576 B |
| 4,535,528 | 8/1985 | Chen et al. | 29/571 |

OTHER PUBLICATIONS

Tsang et al, "Fabrication of High-Performance LDDFET's with Oxide Sidewall-Spacer Technology", IEEE Transactions, vol. ed-29, No. 4, Apr. 1982.

Ogura et al, "Design and Characteristics of the Lightly Doped Drain-Source (LDD) Insulated Gate Field-Effect Transistor", IEEE Transactions, vol. ed-27, No. 8, Aug. 1980.

Kern et al, RCA Review, vol. 43, Sep. 1982.

*Primary Examiner*—Upendra Roy
*Attorney, Agent, or Firm*—Hill, Van Santen, Steadman & Simpson

[57] ABSTRACT

A method for the manufacture of a large scale integration (LSI) MOS field effect transistor wherein a gate electrode is generated on a doped silicon substrate, source/drain regions are formed by ion implantation using the gate electrode as an implantation mask and the source/drain regions are shielded by means of an oxide layer extending to the sidewalls of the gate electrode so that the diffusion of the implanted source/drain regions under the gate electrode area are reduced. The specific improvement of the present invention involves applying a readily flowable silicate glass layer as a gate edge masking for the source/drain ion implantation after formation of the gate electrode, the silicate glass layer being applied by deposition from the vapor phase at a thickness such that the dopant ions in the subsequent source/drain ion implantation are still implanted into the zone near the surface under the silicate glass layer but ion implantation into the zones at the edges of the gate is suppressed.

9 Claims, 7 Drawing Figures

METHOD OF MAKING MOS FETS USING SILICATE GLASS LAYER AS GATE EDGE MASKING FOR ION IMPLANTATION

BACKGROUND OF THE INVENTION

1. Field of the Invention

The present invention is in the field of manufacturing LSI MOS field effect transistors wherein the gate electrode is used as an implantation mask and a silicate glass layer is applied as a gate edge masking for the ion implantation.

2. Description of the Prior Art

MOS processes in VLSI (very large scale integration) technology are employed in order to manufacture components with high packing density and high switching speeds. In addition to parasitic line capacitances, parasitic capacitors in the transistors themselves play a large part since they represent a limit for the gate transit times which can be obtained. The lateral outward diffusion of the highly doped source/drain regions into regions below the transistor gate leads to a significant increase of the so-called Miller capacitance between gate and diffusion regions.

The under-diffusion of the MOS transistor gate may be possibly prevented by a pullback of the implantation edge from the edge of the gate. A method of this type is disclosed in German Patent Application No. P 33 14 450.8 (corresponding to U.S. Ser. No. 589,639, filed Mar. 14, 1984 and assigned to the same assignee as the present application). In this application, a spacer oxide is formed by re-oxidation of a polysilicon gate before the source/drain implantation. The temperatures required are about 900° C. and above, and an oxidation time of about 2 to 3 hours. This exposure to high temperatures is harmful to the component structures that have already been produced.

A further method wherein a space between the gate and the edge of the source/drain ion implantation is provided by means of an oxide layer at the sidewalls of the transistor gate is described in an article by Tsang et al in IEEE Trans. Electr. Dev. ED-29 (1982), pages 590 through 596. This article describes a fabrication process for lightly doped source/drain field effect transistors using $SiO_2$ sidewall spacers. In this method, the deposited spacer oxide layers must be anisotropically etched before the source/drain implantation.

Another method for the reduction of diffusion under the gate area of MOS transistors is known from an article by Ogura et al (IEEE Trans. Electr. Dev. ED-27 (August 1980), pages 1359–1367). In this process, the source/drain implantation is carried out by means of using a polysilicon gate electrode as the mask. The polysilicon gate is subsequently over-etched. Such etching processes are critical production steps in VLSI technology and are to be avoided insofar as possible.

SUMMARY OF THE INVENTION

The present invention provides for carrying out an MOS process of the type previously described wherein the disadvantages which occur in the methods of the prior art are avoided and the manufacture of the desired circuit element is implementable with a minimum number of process steps which employ masking. Further, the process of the invention provides for leveling out steep steps on the surface of the semiconductor.

The objective noted above is achieved by using a free-flowing silicate glass layer as a gate edge masking for the source/drain ion implantation, the layer being applied after the structuring of the gate electrode and being applied by means of deposition from the vapor phase, i.e., chemical vapor deposition. The thickness of the layer is such that the dopant ions in the succeeding source/drain implantation are still barely implanted into the zone under the silicate glass layer close to the surface, but any ion implantation into the zones at the edges of the gate is suppressed.

The method of the present invention differs from known methods because of the type of oxide used and the temperature load required as well as by eliminating oxide etching steps.

The readily flowable silicate glass layer consisting of a boron phosphorus silicate glass is disclosed in an article by Kern and Schnable in the RCA Review, Volume 43 (1982), pages 422 through 457. This article is incorporated herein by reference. In addition to this boron phosphorus silicate glass, other phosphorus silicate glasses or other silicon oxides deposited from the vapor phase can also be employed.

Whereas the thickness of the silicate glass layer is adjusted to a value at which the source/drain ion implantation with the intended implantation dopant into the zone close to the surface under the silicate glass can still be carried out in the regions remote from the gate edges, relatively steep oxide sidewalls at the lateral surface of the gate electrode are obtained after the chemical vapor deposition. These sidewalls have a higher layer thickness which acts as a mask in the implantation. The temperature treatment following the implantation causes flowing and rounding the edges as well as annealing the ion implantation. This temperature treatment can be carried out at tempertures below 900° C. The doping profile which occurs after the anneal is relatively steep and corresponds to a step-shaped pn-junction.

The method of the invention can also be carried out such that the silicate glass layer is deposited before the source/drain implantation and is caused to flow by means of a temperature treatment at a temperature below 900° C. The layer thickness is adjusted during the deposition such that the glass layer at the edges of the gate acts as a mask in the following source/drain implantation step up to a certain spacing from the gate but then continuously loses its masking effect and is just thick enough in the region remote from the gate that the dopant ions are implanted under the silicate glass layer in the zone located close to the surface. Pronounced roundings occur at the edges of the gate and slanted sidewalls occur at the lateral face.

The new process is also applicable to non-oxidizable gate materials such, for example, as the silicides of high melting point metals (refractory metals) in addition to polysilicon.

Specifically, the preferred silicide is tantalum silicide ($TaSi_2$).

In one preferred embodiment of the invention, in the manufacture of n-channel transistors, the ion implantation for the production of a flat source/drain terminal diffusion zone is carried out before the deposition of the silicate glass layer which covers the gate. The ion implantation in this case is preferably carried out with arsenic ions.

In the case of a boron phosphorus silicate glass used for edge masking, the layer thickness is controlled to the vicinity of 100 nm.

The preferred range of temperatures for the treatment before or after source/drain ion implantation is in the range from 800° to 900° C.

The ion implantation may also be carried out with phosphorus ions.

The method of the present invention is particularly applicable for the manufacture of components in VLSI technology which contain n-channel and/or p-channel MOS transistors.

BRIEF DESCRIPTION OF THE DRAWINGS

The process steps up to the structuring of the gate composed of polycrystalline silicon are well-known process sequences. The further process steps have been illustrated in FIGS. 1 through 7 and, as will be explained, they can be differently combined.

DESCRIPTION OF THE PREFERRED EMBODIMENTS

Figure 1:
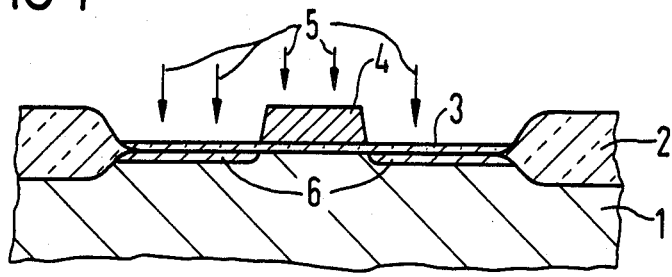

In FIG. 1, there is shown a substrate 1 consisting of p-doped silicon in which the active transistor zones are separated by field oxide regions 2 and on which a gate oxide 3 is generated at a layer thickness of about 20 nm. An implantation with arsenic ions as indicated by the arrows 5 is carried out after the structuring of the gate electrode 4 consisting of polysilicon, typically being carried out with a dose and energy of $4 \times 10^{15}$ cm$^{-2}$ and 40 keV for the manufacture of a flat terminal diffusion zone 6.

Figure 2:
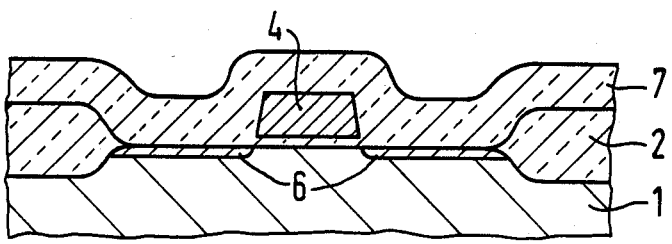

In FIG. 2, there is shown a layer 7 composed of a boron phosphorus silicate glass which is applied across the width of the surface in a layer thickness of about 100 nm by means of a chemical vapor deposition process. For purposes of greater clarity, the gate oxide layer 3 is no longer shown beginning with FIG. 2.

Figure 3:
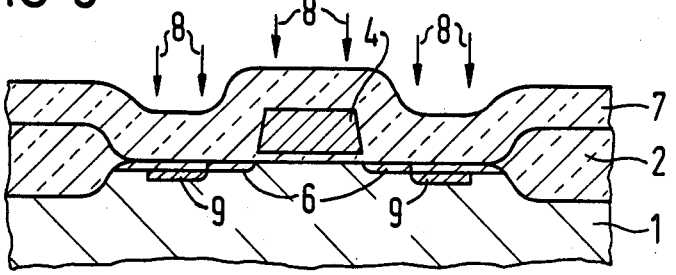

In one alternative method of the invention, shown in FIG. 3, the source/drain implantation with phosphorus ions indicated by the arrows 8 takes place for generating the source/drain zones 9 typically with a dose and energy of $6 \times 10^{15}$ cm$^{-2}$ and 100 keV.

Figure 4:
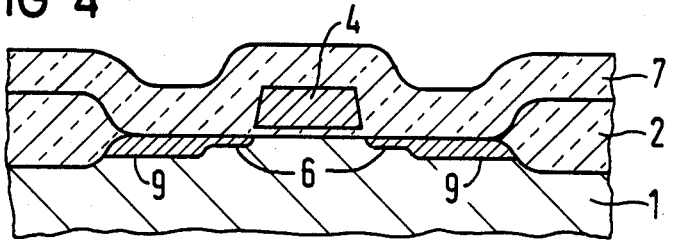

After the conclusion of a temperature treatment to cause flow of the glass at a temperature of about 800° to 900° C., the glass layer 7 is caused to flow and the ion implantation 8 is annealed, resulting in the structure shown in FIG. 4. The doping profile is relatively steep and corresponds to a step-shaped pn-junction (1,6,9).

Figure 5:
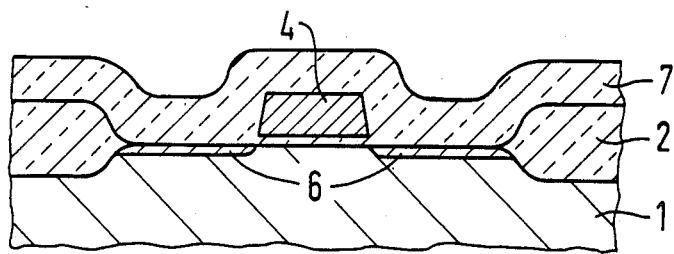

FIG. 5 illustrates a second alternative form of the invention wherein the flowing which takes place at 800° to 900° C. is carried out after the generation of the terminal diffusion zone 6 shown in FIG. 1 and after application of the boron phosphorus silicate glass layer 7 and before the source/drain ion implantation. Pronounced roundings occur at the edges of the gate 4 and sloped sidewalls occur at the lateral faces. As a result of proper selection of the layer thickness in relation to the heat-treating temperature, the "flowed" boron phosphorus silicate glass layer 7 at the edges of the gate 4 is of such thickness that it acts as a mask in the following source/drain implantation step for a desired spacing from the gate 4 but then continuously loses its masking effect and is of just sufficient thickness in the region remote from the edge of the gate that the implanted ions proceed into the desired semiconductor region 1 below the boron phosphorus silicate glass insulating layer 7.

Figure 6:
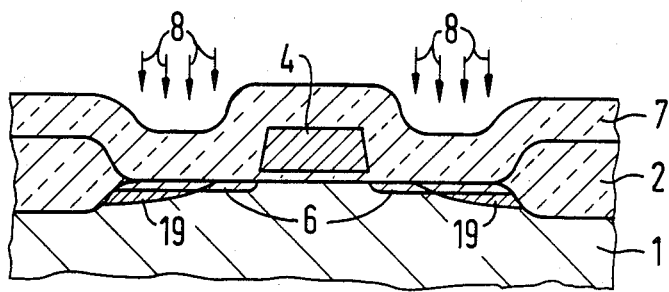

FIG. 6 shows the generation of the source/drain zone 19 by means of a phosphorus ion implantation indicated by the arrows 8 at a dose and energy of $6 \times 10^{15}$ cm$^{-2}$ and 100 keV.

Figure 7:
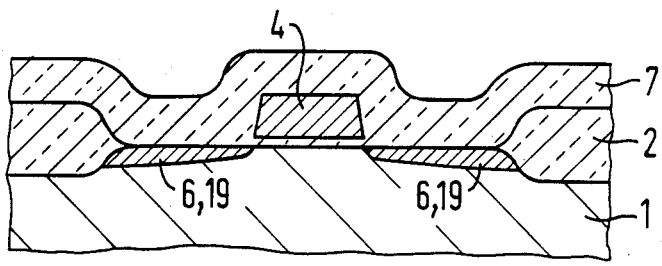

As a result of the subsequent annealing of the ion implantation 8, a slanted doping profile arises which corresponds to a "graded junction" in the pn-junction (1,6,9). The shape of the profile contributes significantly to the breakdown voltage resistance of the n-channel transistors. Following the process steps shown in FIG. 4 or FIG. 7, the intermediate oxide which can likewise consist of boron phosphorus silicate glass is deposited in a layer thickness of about 500 nm and the arrangement is optionally then subjected to another flow process. The application of contacts then occurs in the usual way.

It should be evident that various modifications can be made to the described embodiments without departing from the scope of the present invention.

We claim as our invention:

1. In a method for the manufacture of a large scale integration (LSI) MOS field effect transistor wherein a gate electrode is generated on a doped silicon substrate, source/drain regions are formed by ion implantation using said gate electrode as an implantation mask and wherein the source/drain regions are shielded by means of an oxide layer extending to the sidewalls of said gate electrode whereby the diffusion of the implanted source/drain regions under the gate electrode area is reduced, the improvement which comprises:

applying a readily flowable boron phosphorus silicate glass layer at a temperature below 900° C. as a gate edge masking for the source/drain ion implantation after formation of said gate electrode, said silicate glass layer being applied by deposition from vapor phase, the thickness of said layer being such that it acts as a mask at the sidewalls of said gate electrode during the subsequent source/drain implantation step to a specific spacing from said gate but thereafter loses its masking effect and is than only sufficiently thick enough in the region remote from the edge of said gate so that the dopant ions are still implanted into the zone near the surface under said silicate glass layer.

2. A method according to claim 1 wherein said gate electrode is composed of polysilicon.

3. A method according to claim 1 wherein said gate electrode is composed of a silicide of a high melting point metal.

4. A method according to claim 1 which includes the step of producing a flat source/drain terminal diffusion zone in said substrate before depositing said silicate glass layer over said gate electrode.

5. A method according to claim 1 wherein a boron phosphorus silicate glass is deposited to a thickness of about 100 nm.

6. A method according to claim 1 wherein the temperature treatment before and/or after said source/drain ion implantation is carried out at a temperature between 800° and 900° C.

7. A method according to claim 1 wherein said ion implantation is carried out with phosphorus ions.

8. A method according to claim 3 wherein said gate electrode is composed of tantalum silicide.

9. A method according to claim 4 wherein said ion implantation is carried out with arsenic ions.

* * * * *